United States Patent [19]
Weissman

[11] 4,193,040
[45] Mar. 11, 1980

[54] HIGH-VOLTAGE AMPLIFIER WITH LOW OUTPUT IMPEDANCE

[75] Inventor: Barry Weissman, West Windsor Township, Mercer County, N.J.

[73] Assignee: Western Electric Company, Inc., New York, N.Y.

[21] Appl. No.: 956,942

[22] Filed: Nov. 2, 1978

[51] Int. Cl.² .......................... H03F 1/34; H03F 3/04
[52] U.S. Cl. ....................................... 330/293; 330/98; 330/108; 330/297
[58] Field of Search .................... 330/75, 98, 108, 291, 330/293, 297

[56] References Cited

U.S. PATENT DOCUMENTS

| | | | |
|---|---|---|---|
| 3,679,986 | 7/1972 | Zaman | 330/86 |
| 3,736,519 | 5/1973 | Smyth | 330/282 X |
| 3,868,580 | 2/1975 | Battjes | 330/293 |
| 3,922,585 | 11/1975 | Andrews | 330/293 X |
| 3,940,708 | 2/1976 | Sumi et al. | 330/254 |
| 3,968,453 | 7/1976 | Hongu | 330/254 |

*Primary Examiner*—James B. Mullins
*Attorney, Agent, or Firm*—B. W. Sheffield

[57] ABSTRACT

The technical field to which this invention pertains is high-voltage amplifiers. The amplifier includes a high-voltage capacitor (C1) across which the output of the amplifier is developed. This capacitor is charged towards the supply potential (V) by a constant current generator (10). At the same time, the capacitor is continuously discharged by a controllable current generator (11). A voltage amplifier (13) connected to the input signal to be amplified and to a scaled-down version (R,R) of the output of the high-voltage amplifier, alters the rate at which the capacitor is discharged and, hence, the output voltage developed across the capacitor. The principal use of the invention is to drive the electrostatic deflection plates of an ion implantation machine or an electron beam milling apparatus. The invention may also be used to drive other highly capacitive loads, for example, piezo-electric crystal devices.

2 Claims, 2 Drawing Figures

HIGH-VOLTAGE AMPLIFIER WITH LOW OUTPUT IMPEDANCE

TECHNICAL FIELD

Broadly speaking, this invention relates to voltage amplifiers. More particularly, in a preferred embodiment, this invention relates to a voltage amplifier having both low distortion and low output impedance and which is capable of developing output signals at relatively high voltage levels.

BACKGROUND OF THE INVENTION

It is frequently found necessary to connect the output voltage amplifier to a capacitive load. For example, where a load is physically located an appreciable distance from the driving amplifier, a co-axial cable is typically used to connect the load to the amplifier. This cable will look like a shunt capacitor to the output stages of the amplifier. Another example is where an amplifier is to be connected to a piezo-electric transducer, or the like, which also looks like a shunt capacitor to the driving source.

When, in addition to the above, the amplifier is called upon to deliver a high-voltage, low-distortion output signal, the known circuit designs fail because the prior art high-voltage amplifiers invariably have a high output impedance and are, hence, unsuitable for use with capacitive loads.

SUMMARY OF THE INVENTION

As a solution to these and other problems, the instant invention comprises a capacitor across which the output of the amplifier is developed, and a constant current generator which charges the capacitor towards the potential of the external power source. This arrangement is characterized by a controllable current generator for discharging the capacitor and by means, responsive to the input signal to be amplified, for altering the rate at which the controllable current generator discharges the capacitor.

The invention and its mode of operation will be more fully understood from the following detailed description, when taken with the appended drawings in which:

DETAILED DESCRIPTION

Figure 1:
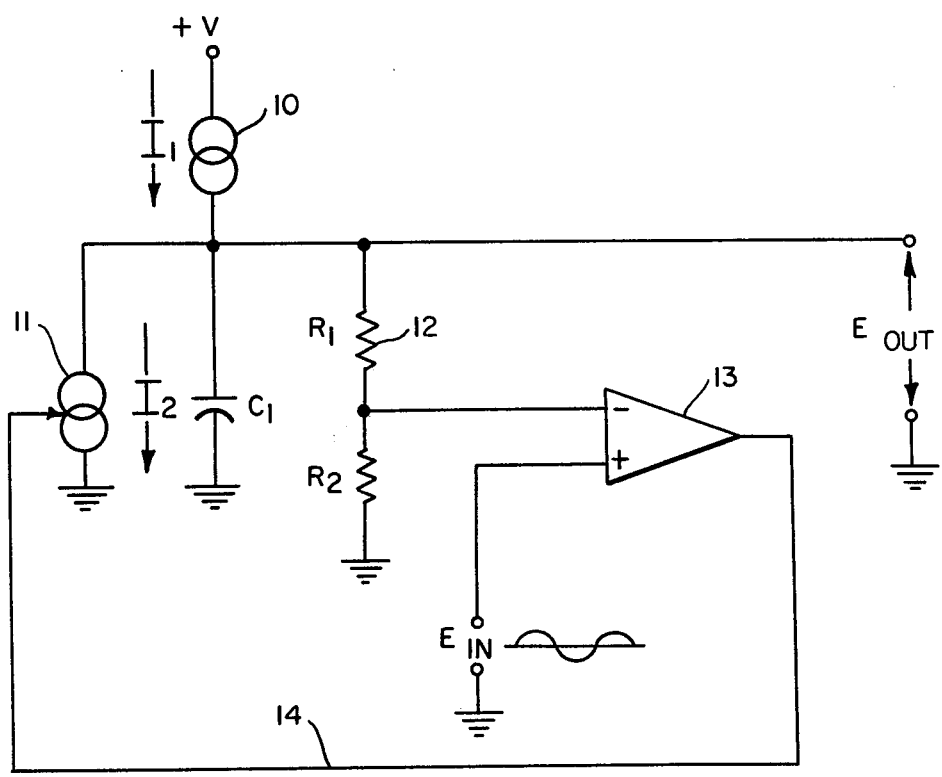
FIG. 1 is a somewhat simplified schematic drawing of an illustrative embodiment of the invention.

FIG. 1 is a simplified schematic drawing of a first, illustrative embodiment of the invention. As shown, a constant-current generator 10 is connected between an external high-voltage power supply V and one plate of a capacitor C1. A second, controllable-current generator 11 is connected to the same plate of capacitor C1 as generator 10, but in the opposite polarity, so as to tend to discharge rather than charge the capacitor. A voltage-divider 12, comprising resistors R1 and R2 in series, is connected between capacitor C1 and ground. The juncture of resistors R1 and R2 is connected to the inverting input of an operational amplifier 13. The signal to be amplified $E_{in}$ is connected to the non-inverting input of amplifier 13 and the output of the amplifier is connected, via a line 14, to the control input of generator 11. The amplified output signal $E_{out}$ is obtained across capacitor C1.

In operation, constant-current generator 10 charges capacitor C1 towards the supply voltage V, which may be as high as 10 kV, while at the same time generator 11 discharges capacitor C1. Voltage divider 12, which is connected across capacitor C1, applies a fraction of the voltage developed across the capacitor to the inverting input of amplifier 13 which multiplies the difference between this voltage and the input voltage by the amplifier gain A. If the signal which is applied to the inverting input of amplifier 13 is greater than the instantaneous value of $E_{in}$, the output signal from amplifier 13 will cause current generator 11 to increase the rate at which capacitor C1 is discharged. On the other hand, if the signal which is applied to the inverting input of amplifier 13 is less than the instantaneous value of $E_{in}$, the output signal will cause current generator 11 to decrease the rate at which C1 is discharged.

It will be appreciated that by connecting current generator 11 to a second potential source having a polarity which is opposite to that of source V, rather than to ground, bi-polar rather than monopolar operation can be achieved. That is to say, in the circuit shown in FIG. 1, the output voltage developed across C1 never falls below zero (ground) potential, but fluctuates about some fixed d.c. level. However, for bi-polar operation when a second potential source, of opposite polarity, is connected to generator 11, the voltage across capacitor C1 can pass through zero potential and, in fact, will fluctuate about zero, being bounded on its positive excursions by the supply potential $+V$ and on its negative excursions by the supply potential $-V$.

Figure 2:
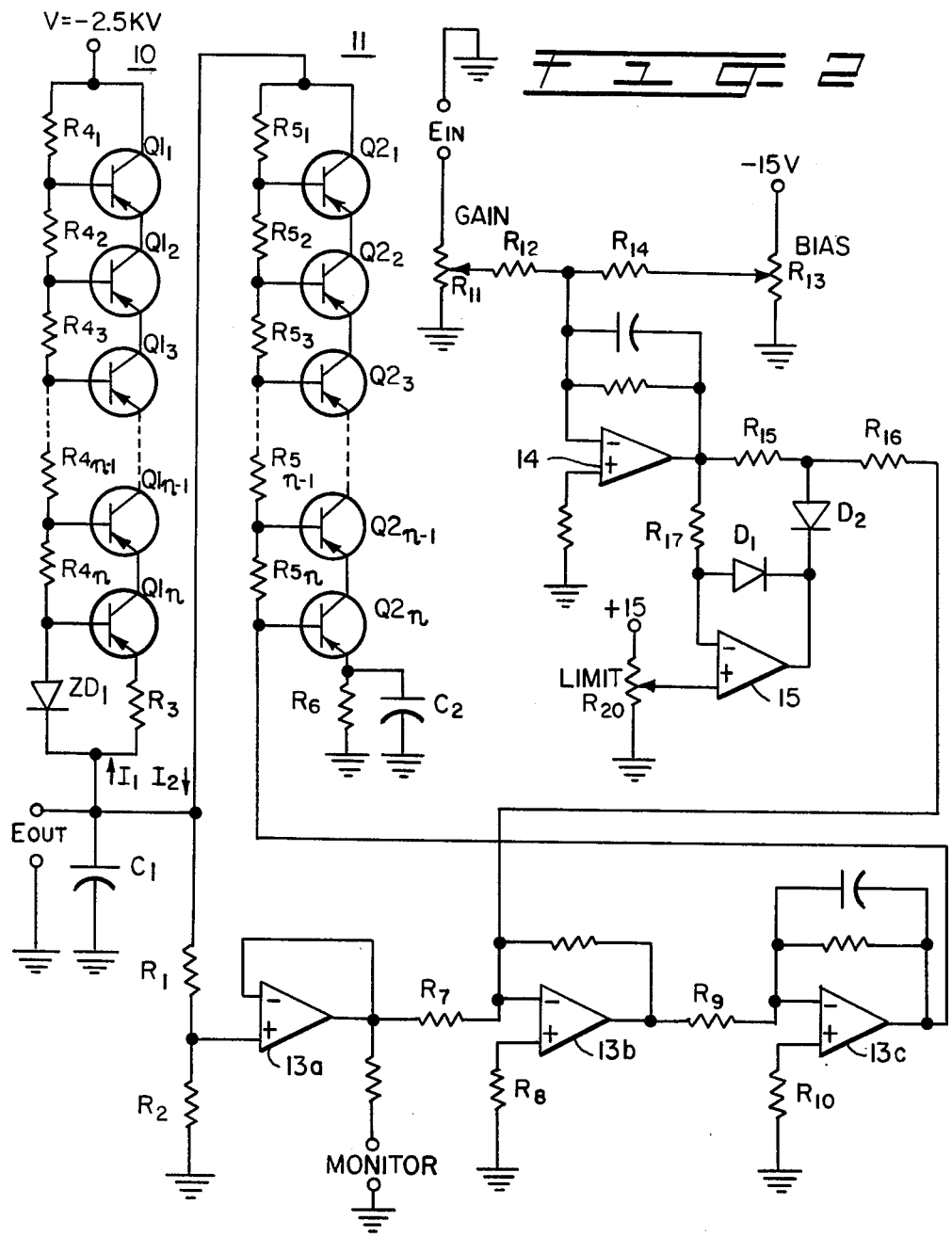
FIG. 2 is a schematic drawing of the embodiment shown in FIG. 1 in considerably more detail.

FIG. 2 depicts an illustrative embodiment of the invention which was actually built and tested. Again, the monopolar version is shown, but as discussed above, bi-polar operation can readily be achieved.

As shown, current generator 10 comprises n PNP transistors, $Q1_1$-$Q1_n$ connected in series. The collector of transistor $Q1_1$ is connected to the supply source, $-2.5$ kV in the illustrative example, while the emitter of transistor $Q1_n$ is connected to capacitor C1, via a current limiting resistor R3. Similarly, the base of each transistor other than $Q1_n$, is connected to the corresponding juncture of two resistors in a chain of n series connected biasing resistors, $R4_1$-$R4_n$. The upper end of the voltage divider is connected to the supply source V while the base of transistor $Q1_n$ is connected to capacitor C1 via a reverse-biased, Zener diode ZD1. The value of n depends, of course, on the particular type of transistor employed to construct the current generator. In general, if each of resistors $R4_1$-$R4_n$ has the same value, then the potential developed across the emitter-collector junction of each transistor will be the same. Thus, if the particular transistor selected can safely withstand a collector-emitter potential of 250 volts, say, and the supply potential is $-2.5$ kV, then obviously a minimum of 10 transistors is required for current generator 10. In the embodiment of the invention actually built and tested, each transistor was a type MJE 350. Under some circumstances an FET transistor and a biasing resistor may be substituted for $R_3$ and the Zener diode omitted.

In an entirely analogous manner, the controllable current generator 11 comprises n transistors $Q2_1$-$Q2_n$ connected in series between capacitor C1 and ground. Again, the base of each transistor in the series other than $Q2_n$ is connected to the corresponding juncture of a second chain of n series-connected biasing resistors, $R5_1$-$R5_n$. The upper end of the resistor chain in generator 11 connects to capacitor C1; however, the lower end is connected to the output of an operational amplifier 13c.

In FIG. 1, the voltage developed at the juncture of resistors R1 and R2 is added to the input voltage $E_{in}$ and amplified in a single operational amplifier 13. In the embodiment actually built and tested, amplifier 13 comprises three operational amplifiers, 13a, 13b and 13c. The actual voltage amplification is performed in amplifiers 13b and 13c, which are connected in series. Amplifier 13a is provided merely to act as a high impedance buffer for voltage divider $R_1/R_2$. Amplifier 13c compensates for the 180° phase-shift created by amplifier 13b.

In FIG. 2, the signal to be amplified, $E_{in}$, is applied via a gain-control resistor R11 and a fixed resistor R12 to the inverting input of an operational amplifier 14 which amplifies the signal. The amplified version of $E_{in}$ is then applied, via resistors R15 and R16, to the inverting input of amplifier 13b which also receives, via buffer 13a, the feedback-voltage developed across the voltage divider R1,R2. An operational amplifier 15, a variable resistor R20 and a pair of diodes D1 and D2, act to limit the maximum potential that can be applied to the input of amplifier 13b, thus preventing $E_{out}$ from rising to a level which might damage the load connected thereto. A variable resistor R13, connected to the input of amplifier 14 via a fixed resistor R14, is used to adjust the DC level of the output signal.

The operation of the circuit disclosed in FIG. 2 is essentially the same as that discussed with reference to FIG. 1. That is to say, capacitor C1 is charged by the current flowing through the constant current generator 10 i.e., the series connection of transistors $Q1_1$-$Q1_n$. Even though the voltage across capacitor C1 rises as the capacitor becomes charged, the current delivered by generator 10 remains substantially constant because the bias which is applied to the base of each of the transistors $Q1_1$-$Q1_n$ is derived from the voltage drop developed across the back-biased Zener diode ZD1, which will be constant over a wide range of voltage. Current generator 11 is not a constant current generator, in the true sense of the word, because the current that it generates or sinks is a function of the potential applied to the base of transistors $Q2_1$-$Q2_n$ which, in turn, depends upon the output of operational amplifiers 13b and 13c. The voltage developed at the input of operational amplifier 13b is, of course, the difference between the output of operational amplifier 14, which receives the input signal to be amplified, $E_{in}$, by way of the gain control R11 and the attenuated output voltage. Thus, as previously explained, variations in the amplitude of $E_{in}$ are applied to the base of transistors $Q2_1$ through $Q2_n$ to vary the current flowing therethrough, which, in turn manifests itself as a corresponding voltage swing across capacitor C1. In the illustrative embodiment built and tested, capacitor C1 comprised a 0.001 microfarad capacitor with a voltage rating of 5 kV. Resistors R1 and R2 respectively comprised a 100 megOhm and a 100 kilOhm resistor thus giving a ratio of 1000 to 1 for the voltage divider. Thus, if the maximum voltage swing developed across capacitor C1 is 2500 volts, then the maximum voltage swing applied to the input of amplifier 13b is 2.5 volts.

It is a relatively a easy matter to derive an expression for the slew rate of the amplifier shown in FIG. 2. The derivation is as follows: 0070

Thus, if $C_1 = 0.001$ mf and we require a slew rate of 100 kV per second, then generator 10 must supply a minimum 100 μA. To discharge $C_1$ at this rate, generator 11 must sink 200 μA, since generator 10 remains at constant current.

One skilled in the art will appreciate that, because the output of the amplifier is developed across a capacitor, the amplifier will inherently possess a low output impedance and, hence, be ideally suited for driving a capacitive load. It will also be appreciated that the load itself may have sufficient capacity to act as capacitor C1 and that no discrete capacitor need then be provided in the amplifier circuit. This, however, is not the preferred arrangement because the characteristics of the amplifier then become unpredictable and a function of the particular load that the amplifier is driving at any given instant. By providing a fixed capacitor of known value, the amplifier's characteristics will always be known, provided of course, the capacity of the load does not approach that of the fixed capacitor.

The principal use of the invention is to drive the electrostatic deflection plates of an ion implantation machine or an electron beam milling apparatus. The invention may also be used to drive other highly capacitive loads, for example, piezo-electric crystal devices.

One skilled in the art can make various changes and substitutions to the layout of parts shown without departing from the spirit and scope of the invention.

What is claimed is:

1. A high-voltage amplifier for use with capacitive loads, which comprises:
   (a) a capacitor across which the output of the amplifier is developed;
   (b) a controllable current generator for discharging said capacitor;
   (c) a constant current generator for charging said capacitor towards the potential of an external power source, said constant current generator comprising:
      (1) n transistors each having a base, an emitter and a collector electrode, the collector-emitter paths of each of said n transistors being connected in series between said external power source and said capacitor;
      (2) a voltage-divider for biasing said n transistors, said divider comprising n resistors connected in series between said external power source and said capacitor, to base of the first through (n−1)th transistor, being connected to a corresponding juncture of two adjacent resistors in said voltage divider
      (3) a current limiting resistor connected between the emitter of said nth transistor and said capacitor; and
      (4) a reverse-biased Zener diode connected between the base of said nth transistor and said capacitor; and
   (d) means, responsive to the input signal to be amplified, for altering the rate at which said controllable current generator discharges said capacitor.

2. A high voltage amplifier for use with capacitative loads, which comprises:
   (a) a capacitor across which the output of the amplifier is developed;

(b) a constant current generator for charging said capacitor towards the potential of an external power source;

(c) a controllable current generator for discharging said capacitor, said controllable current generator comprising:
  (1) n transistors each having a base, an emitter and a collector electrode, the collector-emitter paths of each of said n transistors being connected in series between said capacitor and ground;
  (2) a voltage-divider for biasing said n transistors, said divider comprising n resistors connected in series between said capacitor and ground, the base of the first through (n−1)th transistors being connected to a corresponding juncture of two adjacent resistors in said voltage-divider;
  (3) a current-limiting resistor connected between the emitter of said nth transistor and ground; and
  (4) means for supplying a control voltage to the base of said nth transistor; and (d) means, responsive to the input signal to be amplified, for altering the rate at which said controllable current generator discharges said capacitor.

* * * * *

UNITED STATES PATENT OFFICE
CERTIFICATE OF CORRECTION

PATENT NO. : 4,193,040
DATED : March 11, 1980
INVENTOR(S) : Barry Weissman

It is certified that error appears in the above-identified patent and that said Letters Patent are hereby corrected as shown below:

In the specification: Column 1, lines 14-15, "output voltage" should read --output of a voltage--. Column 4, line 1, "relatively a easy" should read --relatively easy--. Column 4, line 3, "0070" should read $$\text{--Let} \quad (I_2 - I_1) = C_1 \frac{d}{dt}(E_{out}) \quad (1)$$

$$\text{Then,} \quad \frac{d}{dt}(E_{out})\,\text{max} = \frac{(I_2 - I_1)\,\text{max}}{C_1} \text{--.}$$

Column 4, line 6, "100µA." should read --current of 100µA.--

In the claims: Column 4, claim 1, line 55, "divider" should read --divider;--.

Signed and Sealed this

Tenth Day of June 1980

[SEAL]

Attest:

SIDNEY A. DIAMOND

Attesting Officer

Commissioner of Patents and Trademarks